United States Patent [19]

Swamy et al.

[11] Patent Number: 5,675,183

[45] Date of Patent: Oct. 7, 1997

[54] HYBRID MULTICHIP MODULE AND METHODS OF FABRICATING SAME

[76] Inventors: Deepak Swamy, 12330 Metric Blvd., #5206, Austin, Tex. 78758; David Lunsford, 23022 Pedernales Canyon, Austin, Tex. 78669

[21] Appl. No.: 501,331

[22] Filed: Jul. 12, 1995

[51] Int. Cl.⁶ .......................... H01L 23/64; H01L 23/053; H01L 23/48
[52] U.S. Cl. ..................... 257/723; 257/700; 257/776
[58] Field of Search ..................... 257/723, 700, 257/685, 686, 697, 724, 776, 777, 779, 722

[56] References Cited

U.S. PATENT DOCUMENTS

| | | | |
|---|---|---|---|
| 4,673,772 | 6/1987 | Satoh et al. | 257/772 |
| 4,724,472 | 2/1988 | Sugimoto et al. | 257/697 |
| 5,276,289 | 1/1994 | Satoh et al. | 257/723 |
| 5,367,435 | 11/1994 | Andros et al. | 257/686 |
| 5,475,264 | 12/1995 | Sudo et al. | 257/723 |

FOREIGN PATENT DOCUMENTS

| | | | |
|---|---|---|---|
| 4-133451 | 5/1992 | Japan | 257/697 |
| 4-152554 | 5/1992 | Japan | 257/697 |
| 4-177870 | 6/1992 | Japan | 257/697 |
| 5-129502 | 5/1993 | Japan | 257/697 |

OTHER PUBLICATIONS

"Hybrid Surface Mount/Pin Grid Array Package", IBM Technical Disclosure Bulletin, vol. 38 No. 01 Jan. 1995, pp. 221–222.

Primary Examiner—Mahshid D. Saadat
Assistant Examiner—Jhihan B. Clark

[57] ABSTRACT

A hybrid multichip module and method for fabricating same provides a cost-effective interconnection of semiconductor chips combining the advantages of modern MCM-D technology with modern MCM-L technology. In a preferred embodiment, the hybrid multichip module has semiconductor chips mounted to an MCM-D structure and interconnected by an MCM-L structure via solder columns.

9 Claims, 2 Drawing Sheets

HYBRID MULTICHIP MODULE AND METHODS OF FABRICATING SAME

BACKGROUND OF THE INVENTION

The present invention relates generally to semiconductor chips and methods of interconnecting them and, in a preferred embodiment thereof, more particularly provides a multichip module which is a hybrid of MCM-D and MCM-L technology, combining the best features of both.

As electronic circuits have become increasingly miniaturized and able to perform an increasingly large number of operations in a set amount of time, the competition among manufacturers to produce smaller, faster, cheaper, and more reliable electronic circuits has likewise increased. In a typical electronic circuit there are numerous integrated circuits on semiconductor "chips" and these chips are interconnected with conductors. The conductors enable the chips to electrically communicate with one another.

The semiconductor chip art has advanced to the point that the overall speed capability of a modern high performance electronic circuit is limited not by the speed at which the chips can process information, but by the speed at which the interconnecting conductors can transport communication electrically among the chips. Along with the advances in semiconductor chip speed, the chips have become so miniaturized that the overall size of an electronic circuit is, again, not limited by the size of the electronic components themselves (i.e. semiconductor chips, resistors, diodes, etc.), but by the space required to interconnect the components.

A number of advances have been made in the art of interconnecting semiconductor chips to lower overall cost, decrease space requirements, and increase overall speed and reliability of electronic circuits. Some of these advances have been directed toward grouping the chips together on a common substrate and interconnecting them with the highest density, shortest conductors possible. These common substrates with multiple chips interconnected thereon are known as multichip modules. In general, the shorter the conductor, the less delay time is encountered in getting an electric signal from one end to the other. The higher the density of conductors on the substrate, the smaller the package size. Conductor density is measured in units of $cm/cm^2$, or the length of conductor per substrate area.

One type of multichip module is known as MCM-L. For purposes of this specification, an MCM-L is defined as a multichip module in which the substrate is made of typical printed circuit board materials such as reinforced and unreinforced epoxies and polyimides and the conductors are typically copper. Layers of these are laminated together and interlevel connections made by drilling holes through the layers and metallizing the holes or "vias". Modern high performance MCM-L's are capable of achieving conductor densities of up to approximately 300 $cm/cm^2$. MCM-L's also have the lowest production cost per $cm^2$ of any of the multichip modules discussed here. However, there are some disadvantages inherent in the MCM-L's. Many layers are required to achieve the highest conductor densities. The typical printed circuit board materials are not capable of withstanding the high temperatures necessary to reflow high temperature solder used in chip mounting techniques, such as those techniques known as C-4 and C-5.

Another type of multichip module is known as MCM-C. MCM-C's are fabricated using high temperature materials such as ceramic or glass-ceramic. A material slurry is cast into green sheets and interlevel connections are made by mechanically punching holes in the green sheets. Conductive pastes of fireable materials such as tungsten, molybdenum, gold, silver, or palladium are screen printed onto the green sheets which are then laminated, cut to size, and fired. The screen printing of conductors enables MCM-C's to achieve conductor densities up to approximately 400 $cm/cm^2$, and the use of high temperature materials enables the use of the C-4 and C-5 chip mounting techniques. However, these advantages come at a high cost. Because of the materials used and the elaborate production process, MCM-C's typically cost approximately five to six times what an MCM-L costs per $cm^2$. Also, since conductor density is limited by the screen printing process, many layers are required to achieve the highest densities.

The multichip module capable of achieving the highest density in the least number of layers is the MCM-D. For purposes of this specification, MCM-D will be defined as a multichip module having a rigid substrate made of materials such as ceramic, glass-ceramic, silicon, and metal in which interconnections between chips are made by conductors deposited by processes such as evaporation, sputtering and plating, and dielectric materials such as polyimide are used to separate the conductor layers. Photolithography is typically used to define features in the dielectric material which are then filled with conductive material. It is the use of photolithography with its ability to reproduce extremely fine detail that enables MCM-D's to achieve conductor densities of approximately 800 $cm/cm^2$. The use of high temperature substrate materials also allows the use of C-4 and C-5 chip mounting techniques and also allows the substrate to be used as a heat sink for the heat produced by the chips. As with the MCM-C's, these multichip modules exact an increased cost for their increased performance as compared with the MCM-L. With the MCM-D, however, this increased cost does enable a more than two-fold increase in conductor density. The most significant factor in the increased cost of an MCM-D is the process of depositing the layers of dielectric material and conductors onto the substrate.

From the foregoing, it can be seen that it would be quite desirable to provide a multichip module which combines the advantages of an MCM-D, namely, high temperature capability, chip mounting capability, heat dissipation ability, and high conductor density, with the advantages of an MCM-L, namely, low cost and ease of fabrication. It is accordingly an object of the present invention to provide such a multichip module and associated methods of producing it.

SUMMARY OF THE INVENTION

In carrying out the principles of the present invention, in accordance with an embodiment thereof, a multichip module is provided which combines the advantages of a typical MCM-D and a typical MCM-L. Semiconductor chips are mounted on a rigid high temperature substrate material using techniques commonly used in MCM-D fabrication, such as the C-4 and C-5 techniques. The substrate provides a high temperature mounting surface for the chips and also acts as a heat-dissipation device for the heat generated by the chips. In a preferred embodiment thereof, the substrate further has a heat-dissipation device such as a typical finned heat sink attached to it to assist in dissipating heat.

To take advantage of the cost-savings associated with MCM-L technology, a preferred embodiment utilizes an MCM-L-type structure to achieve the interconnection between chips. The MCM-L structure is mounted apart from the high temperature substrate structure described above, and connected thereto both electrically and structurally through the use of solder columns.

From a broad perspective, the present invention provides a multichip module assembly including an MCM-D having a body portion with a generally planar first side, a spaced plurality of semiconductor chips mounted on the first side, a spaced series of first electrically conductive pads mounted on the first side outwardly of the spaced plurality of semiconductor chips, and a spaced series of first electrically conductive lead members carried on the MCM-D body portion and electrically coupling the first electrically conductive pads to the plurality of semiconductor chips; an MCM-L having a body portion with a generally planar second side, a spaced series of second electrically conductive pads mounted on the second side, and a spaced series of second electrically conductive lead members carried on the MCM-L body portion and electrically coupling the second electrically conductive pads; the MCM-D and MCM-L being in an orientation in which the first and second sides are in a spaced apart, parallel, facing relationship with the first electrically conductive pads being aligned with the second electrically conductive pads; and a spaced series of electrically conductive column members transversely disposed between the first and second sides, the column members supporting the MCM-D and MCM-L in the orientation thereof, with the opposite ends of each column member being conductively secured to a facing pair of the first and second electrically conductive pads.

The solder columns are sufficiently compliant to absorb any dimensional changes which may occur when the MCM-L-type structure and the MCM-D-type structures are subjected to heat. Such dimensional changes are due to a difference in the coefficients of thermal expansion of the materials used to construct the different structures.

DETAILED DESCRIPTION

Figure 1:
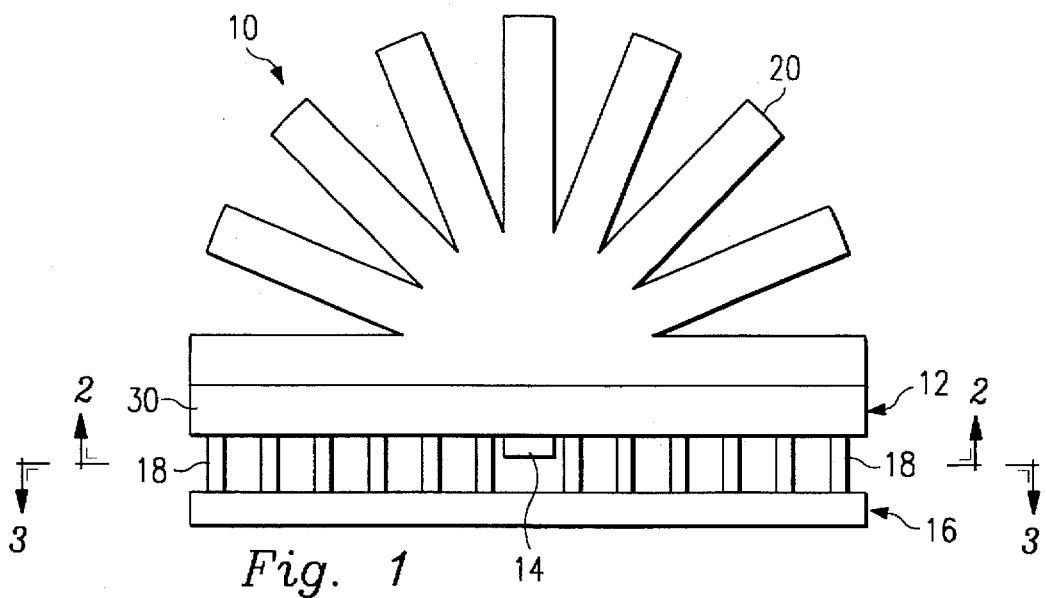
FIG. 1 is a side elevational view of a hybrid multichip module embodying principles of the present invention.

Illustrated in FIG. 1 is a hybrid multichip module 10 which embodies principles of the present invention. The hybrid multichip module includes an MCM-D 12, with semiconductor chips 14 mounted to its bottom side, only one of the chips 14 being visible in FIG. 1. Attached to the top side of the MCM-D 12 is a heat dissipating device 20, representatively shown as a half-cylindrical finned heat sink. It is to be understood that the substrate 30 (FIG. 4) of the MCM-D 12 may act as a heat dissipating device obviating the need for additional heat sinks. Utilizing the MCM-D 12 in this manner takes advantage of the high temperature capabilities and chip mounting advantages associated with MCM-D's.

The hybrid multichip module 10 also includes an MCM-L 16. The MCM-L 16 operates to interconnect the semiconductor chips 14 on the MCM-D 12, and may in another embodiment have semiconductor chips or other electronics mounted thereon. Utilizing the MCM-L 16 in this manner takes advantage of the cost savings associated with typical MCM-L production techniques.

As illustrated in FIG. 1, the MCM-L 16 is disposed beneath the MCM-D 12 and the semiconductor chips 14, in a parallel, spaced apart and facing relationship with the substrate 30, and is electrically and structurally attached to the MCM-D 12 by solder columns 18. Due to a difference in the coefficients of thermal expansion in the materials typically used to produce MCM-D's and MCM-L's, the structural attachment between the MCM-D 12 and MCM-L 16 must be suitably compliant so that dimensional changes may be absorbed without structural failure. The solder columns 18 also serve as conductors, transmitting electrical signals between the MCM-D 12 and the MCM-L 16. Thus, the solder columns 18 in this embodiment perform the three functions of spacing, structurally attaching, and electrically communicating between the MCM-D 12 and the MCM-L 16, but it is to be understood that these functions could be performed by separate alternative structures.

Figure 2:
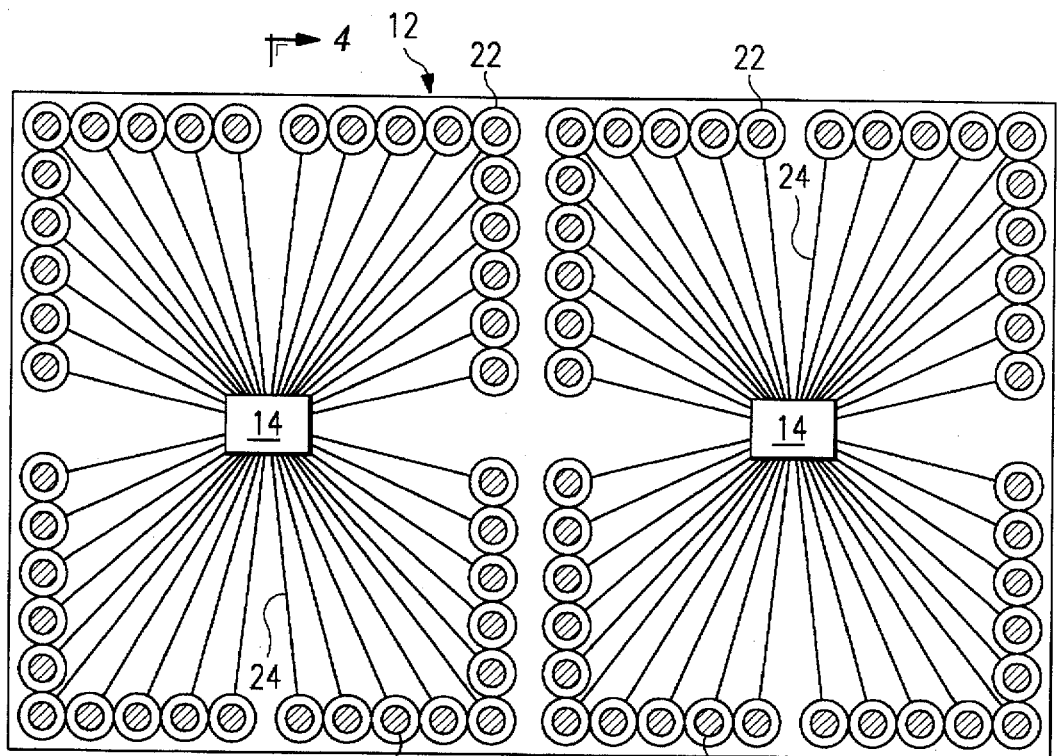
FIG. 2 is an enlarged scale cross sectional view through the module, taken along line 2—2 of FIG. 1 and rotated 90 degrees, illustrating the bottom side of an MCM-D portion of the module.

Referring now to FIG. 2, the mounting of the semiconductor chips 14 onto the bottom side of the MCM-D 12 can be clearly seen. Here only two semiconductor chips 14 are shown for the purpose of clarity, but it is to be understood that modern MCM-D techniques make it possible to mount a great number of semiconductor chips on an MCM-D. On the bottom surface of the MCM-D 12 are a number of conductive lines collectively referred to by those skilled in the art as a fan-out layer 24. The purpose of a fan-out layer is to take the extremely close spacing (pitch) of the conductor attachment points on a semiconductor chip and enlarge that pitch so that electrical connections may be made to the chip. Thus, in FIG. 2 are representatively shown a fan-out layer 24 for each semiconductor chip 14. In this embodiment the fan-out layer conductive lines are coupled at their inner ends to their associated chip 14, and terminate at their outer ends at solder attachment pads 22 to which top ends of the solder columns 18 are conductively attached.

The solder columns 18 are cylindrical and are made of a suitable conductive metal. They are soldered to the solder attachment pads 22 on the MCM-D 12, preferably with the use of a relatively high temperature solder 23 (FIG. 4) so that the solder will not melt when the solder column 18 bottom ends are later soldered to the solder attachment pads 26 on the MCM-L 16.

Figure 3:
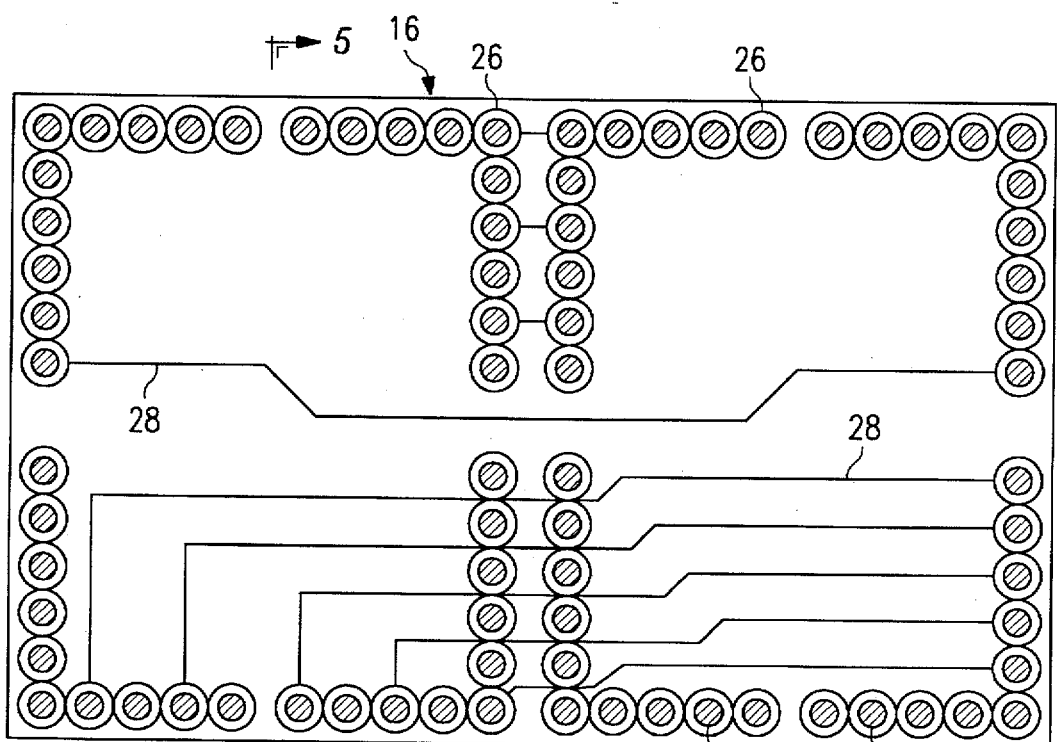
FIG. 3 is an enlarged scale cross sectional view through the module, taken along line 3—3 of FIG. 1 and rotated 90 degrees, illustrating the top side of an MCM-L portion of the module.

Referring now to FIG. 3, an illustration of the top side of the MCM-L 16 can be seen. Solder attachment pads 26 corresponding to the solder attachment pads 22 on the bottom side (FIG. 2) of the MCM-D 12, and aligned therewith, are arranged on the MCM-L 16 top side so that solder columns 18 conductively attached at their opposite ends to the corresponding solder attachment pads 22,26 will be generally perpendicular to the MCM-D 12.

As described above, the solder columns 18 are soldered at their bottom ends to the solder attachment pads 26 on the MCM-L 16. This is preferably done using relatively low temperature solder 25 (FIG. 5). This ensures that, at this point, the relatively high temperature solder 23 (FIG. 4) used to solder the top ends of the solder columns 18 to the solder attachment pads 22 on the MCM-D 12 does not melt.

Another method which could be used to make the structural and electrical connection between the MCM-D 12 and the MCM-L 16 at the solder attachment pads 22,26 is to deposit solder bumps 27 (shown in FIG. 4 & 5 in dashed outline) on the solder attachment pads 22,26 and then melt them together while holding the MCM-D 12 and MCM-L in alignment, with the solder bumps 27 on the respective solder attachment pads 22,26 touching each other. When the solder bumps 27 are in their melted state, the MCM-D 12 and MCM-L 16 could be spaced apart as desired, and then, allowing the solder bumps 27 to re-solidify, the desired spacing could be maintained.

Interconnection between the solder attachment pads 26 on the MCM-L 16 is accomplished by conductive lines 28. For illustrative clarity, only a few of such conductive lines 28 are shown in FIG. 3. It is to be understood that, by interconnecting the solder attachment pads 26 on the MCM-L 16, interconnection of the semiconductor chips 14 on the MCM-D 12 is effected when the MCM-D 12 and the MCM-L 16 are electrically coupled by the solder columns 18.

Electrical connection of the multichip module 10 to an overall electronic system may be made by conventional techniques such as edge connector, pin grid array, or bump grid array.

Figure 4:
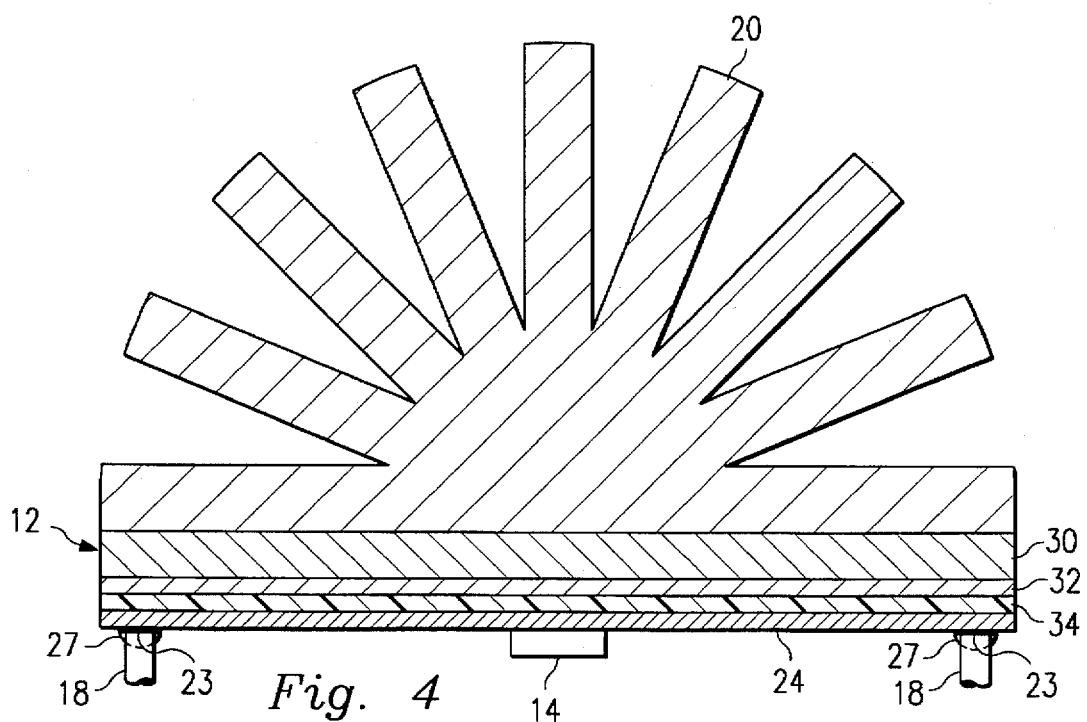
FIG. 4 is an enlarged scale cross sectional view through the module, taken along line 4—4 of FIG. 2 and rotated 90 degrees.
Figure 5:
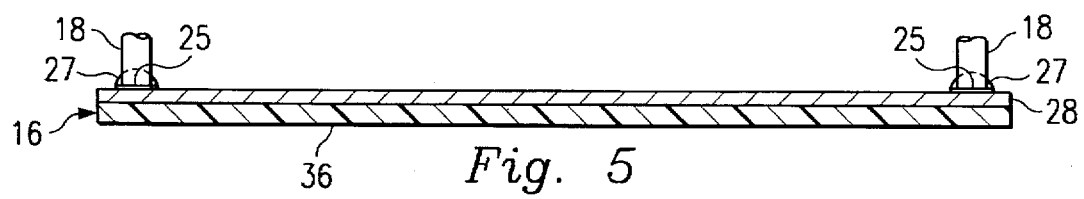
FIG. 5 is an enlarged scale cross sectional view through the module, taken along line 5—5 of FIG. 3 and rotated 90 degrees.

FIG. 4 cross-sectionally illustrates the MCM-D portion 12 of the module 10. The heat dissipating device 20 is attached to the top surface of the substrate 30. In this embodiment the substrate 30 is representatively shown as being nonconductive, but it may in other embodiments be made of a suitable conductive material. Moving downwardly in FIG. 4, a ground plane 32 is attached to the substrate 30 to provide a conductive ground reference. A dielectric layer 34 is attached to the ground plane 32 to provide an insulative layer. The fan-out layer 24 is deposited onto the dielectric layer 34. It is well known in the art for MCM-D's to have multiple layers of conductive traces and dielectric, but in this embodiment only one layer of each is illustrated. Top ends of the solder columns 18 are conductively secured with high temperature solder 23 as described above. Solder bumps 27, as an alternative to the solder columns 18, are illustrated with dashed lines.

FIG. 5 cross-sectionally illustrates the MCM-L portion 16 of the module 10. A layer of a dielectric material 36 performing an insulative function has the previously mentioned conductive lines 28 formed thereon. Although only one insulative layer 36 with conductive lines 28 thereon has been illustrated in this embodiment, it is well known in the art for MCM-L's to have many of such layers. Some of the conductive lines 28 terminate at the solder attachment pads 26. As described above, these solder attachment pads 26 correspond to, and are in alignment with, the solder attachment pads 22 on the MCM-D 12. Bottom ends of the solder columns 18 are conductively secured with low temperature solder 25 as described above. Solder bumps 27, as an alternative to the solder columns 18, are illustrated with dashed lines.

The foregoing detailed description is to be clearly understood as being given by way of illustration and example only, the spirit and scope of the present invention being limited solely by the appended claims.

What is claimed is:

1. A multichip module assembly comprising:

an MCM-D having a body portion with a generally planar first side, a spaced plurality of semiconductor chips mounted on said first side, a spaced series of first electrically conductive pads mounted on said first side outwardly of said spaced plurality of semiconductor chips, and a spaced series of first electrically conductive lead members carried on said MCM-D body portion and electrically coupling said first electrically conductive pads to said plurality of semiconductor chips;

an MCM-L having a body portion with a generally planar second side, a spaced series of second electrically conductive pads mounted on said second side, and a spaced series of second electrically conductive lead members carried on said MCM-L body portion and electrically coupling said second electrically conductive pads;

said MCM-D and MCM-L being in an orientation in which said first and second sides are in a spaced apart, parallel, facing relationship with said first electrically conductive pads; and a spaced series of electrically conductive column members transversely disposed between said first and second sides, said column members supporting said MCM-D and MCM-L in said orientation thereof, with the opposite sides of each column member being conductively secured to a facing pair of said first and second electrically conductive pads;

wherein one of said opposite ends of each column member is conductively secured to one of said first electrically conductive pad with relatively high melting point solder.

2. The assembly according to claim 1, further comprising a heat dissipating device attached to said MCM-D.

3. The assembly according to claim 1, wherein said column members comprise elongated columns made of solder.

4. The assembly according to claim 1, wherein the other of said opposite ends of each column member is conductively secured to one of said second electrically conductive pad with relatively low melting point solder.

5. A multichip module for use with an electronic system, said multichip module comprising:

a generally planar substrate having a top side and a bottom side;

a generally planar ground plane made of a conductive material and having a top side and a bottom side, said top side of said ground plane being attached onto substantially all of said substrate bottom side;

a generally planar dielectric layer having a top side and a bottom side, said top side of said dielectric layer being attached onto substantially all of said ground plane bottom side;

a fan-out layer deposited onto said dielectric layer bottom side, comprising a plurality of expanding pitch conductive traces, said conductive traces each having an interior end and an exterior end and said expanding pitch increasing from said interior ends of said conductive traces to said exterior ends of said conductive traces;

a plurality of first solder attachment pads, each of said solder attachment pads being conductively attached to one of said exterior ends of said conductive traces;

a semiconductor chip having a top side and a bottom side and having circuit attachment points on said top side, each of said circuit attachment points being conductively attached to one of said interior ends of said conductive traces;

a generally planar laminated interconnecting means comprising at least one dielectric layer, at least one conductive layer attached to said at least one dielectric layer, said layer having a plurality of conductors, and a second plurality of solder attachment pads attached to said at least one dielectric layer; and a plurality of conductive columns having a first end and a second end, said first end of each of said columns being conductively attached to one of said first plurality of solder attachment pads, and said second end of each of said columns being conductively attached to one of said second plurality of solder attachment pads.

6. A multichip module according to claim 5, further comprising a heat-dissipating device attached to said top surface of said substrate.

7. A multichip module according to claim 5, wherein said plurality of conductive columns are made of solder.

8. A multichip module according to claim 5, wherein each of said first solder attachment pads correspond to one of said second solder attachment pads such that each of said conductive columns are generally perpendicular to said substrate.

9. A multichip module according to claim 5, wherein said first end of each of said columns is conductively attached to one of said first plurality of solder attachment pads with relatively high melting point solder and said second end of each of said columns is conductively attached to one of said second plurality of solder attachment pads with relatively low melting point solder.

* * * * *

UNITED STATES PATENT AND TRADEMARK OFFICE
CERTIFICATE OF CORRECTION

PATENT NO.    : 5,675,183
DATED         : Oct. 7, 1997
INVENTOR(S)   : Deepak Swamy et al It is certified that error appears in the above-indentified patent and that said Letters Patent is hereby corrected as shown below:

On title page, item [73] insert --Assignee: Dell USA, L.P., Austin, Texas.--

Signed and Sealed this

Fourteenth Day of July, 1998

Attest:

BRUCE LEHMAN

Attesting Officer

Commissioner of Patents and Trademarks